United States Patent [19]

Milkovic

[11] 4,058,768
[45] Nov. 15, 1977

[54] TWO-WAY ELECTRONIC KWH METER

[75] Inventor: Miran Milkovic, Scotia, N.Y.

[73] Assignee: General Electric Company, Schenectady, N.Y.

[21] Appl. No.: 757,799

[22] Filed: Jan. 7, 1977

[51] Int. Cl.² .......................................... G01R 11/32
[52] U.S. Cl. ...................................... 324/142; 324/127
[58] Field of Search ............... 324/142, 141, 140, 107, 324/127

[56] References Cited

U.S. PATENT DOCUMENTS

| 3,875,509 | 4/1975 | Milkovic | 324/142 |
| 3,886,449 | 5/1975 | Wolfinger | 324/142 |
| 3,975,682 | 8/1976 | Mayfield | 324/142 |
| 3,976,942 | 8/1976 | Mayfield | 324/142 |

Primary Examiner—John Kominski
Attorney, Agent, or Firm—Robert E. Brunson; Philip L. Schlamp

[57] ABSTRACT

A two-way electronic kWh meter is disclosed for metering electrial power and energy consumption in a single phase or polyphase electrical system wherein power and energy may be imported to the system or exported from the system to another system. Pairs of analog signals representing current and voltage variables are derived. Each pair of analog signals is multiplied together to derive partial instantaneous power signals. These signals are summed and integrated to thereby provide a signal which is proportional to the total energy being imported or exported with respect to the electrical system. The output of the integrator is converted to a pulse train having each pulse proportional to the energy being imported or exported with respect to the system. The partial instantaneous power signals are also summed and averaged, with the polarity of the resulting signal being detected by a polarity detector. Depending upon the polarity of the signal being detected, an import or export record and display arrangement is connected to receive the pulse train to record the quantity of energy being imported or exported with respect to the system. An error correction system is also provided, wherein the phasing of the voltage variable signals and the phasing of the polarity detector is switched each time an output pulse is generated.

11 Claims, 1 Drawing Figure

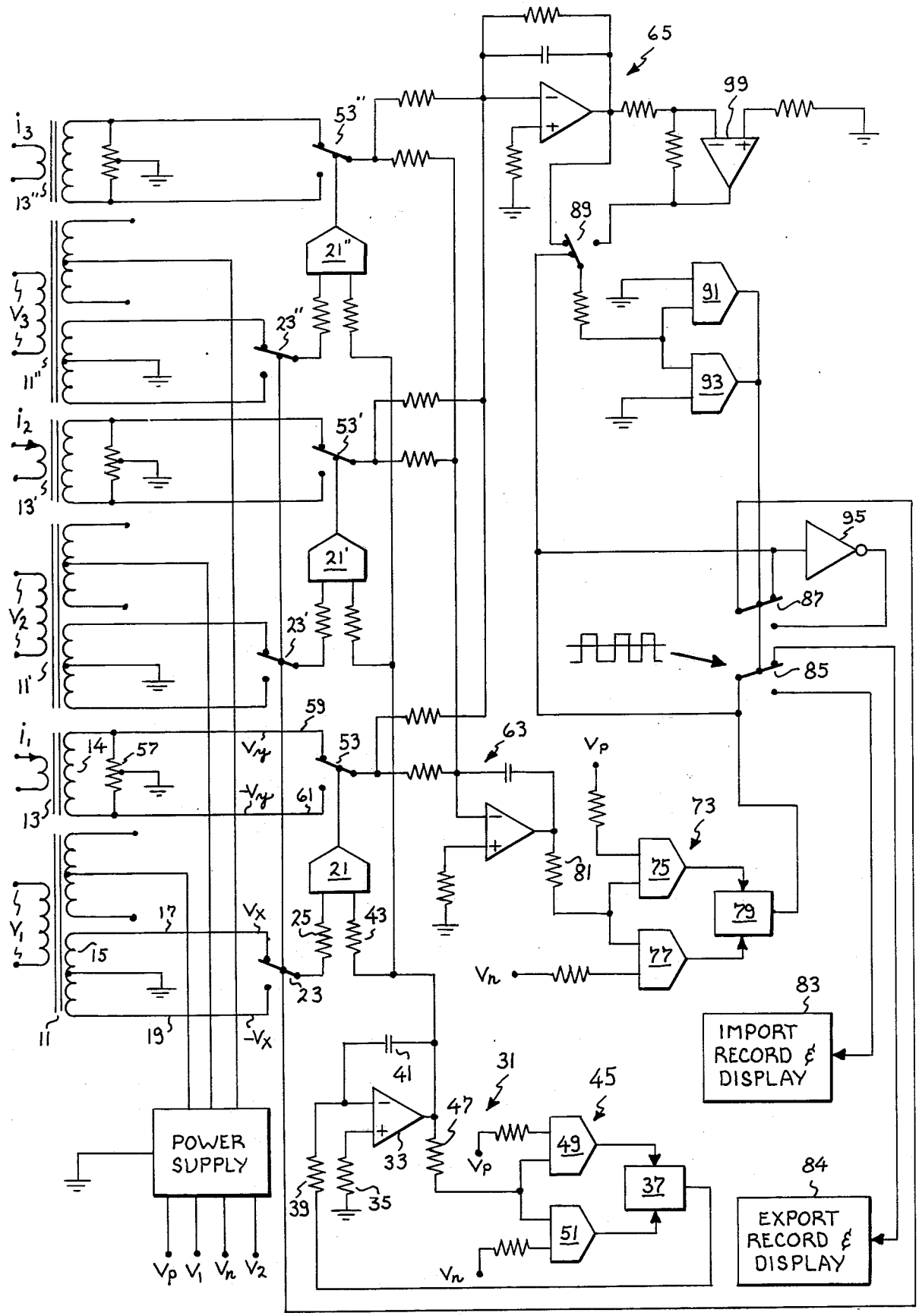

TWO-WAY ELECTRONIC KWH METER

BACKGROUND OF THE INVENTION

This invention relates to an electronic kWh meter, and more specifically, relates to an electronic kWh meter for recording the quantity of energy imported or exported with respect to an electrical system.

This invention relates to the metering of electrical energy in terms of, for example, kilowatt hours in an electrical system. Electrical energy in terms of kilowatt hours, or kWh, has been and continues to be metered with the rotating disc-type of meter which is disclosed in, among other sources, the "Electrical Meterman's Handbook," Chapter 7, 7th Ed., published 1965 by the Edison Electric Institute. The invention hereinafter disclosed represents a departure from the methodology and apparatus exemplified by the rotating disc-type meter. In addition, those who are familiar with the instrumentation and metering arts respecting electrical power and energy know of proposed systems including apparatus employing electronic and solid state devices for measuring power and energy. In such apparatus, the electronic and solid state devices replace the conventional rotating disc. Thus, in prior art systems, the current flowing through a line and the voltage across a load impedance connected to the line are each detected, and signals representing these parameters are coupled to a pulse width amplitude multiplier. The multiplier generates an output signal which is proportional to the product of the detected current and voltage. This signal is then averaged by means of a low-pass filter to provide a D.C. voltage having an amplitude which is proportional to the total average power of the electrical system. This D.C. voltage is converted to a pulse train by means of an analog-to-pulse rate converter, which pulse train has a variable signal repetition rate $f$ which is proportional to the average power in the system, with each output pulse signal representing a constant quantized amount of electrical energy. The output pulse train is then coupled to a display mechanism which may, for example, include a counter or register which performs conventional accumulation, storage and display functions. These prior electronic metering systems do not, however, have an internal error correcting means for correcting an offset error within the meter and, more importantly, do not include in combination therewith means for metering both the quantity of energy imported into the system as well as the quantity of energy exported from the system to an external system.

Accordingly, it is an object of this invention to provide an improved method and apparatus for metering kilowatt hours imported and exported with respect to a single or polyphase A.C. electrical system.

SHORT STATEMENT OF THE INVENTION

Accordingly, this invention relates to a method and apparatus for metering kilowatt hours in an A.C. electrical system wherein the meter records both the importation and exportation of energy with respect to the system. The apparatus includes for each phase of the system a comparator and triangular waveform generator. The triangular waveform generator generates a high frequency signal which is coupled to one input of the comparator. An analog signal proportional to the detected voltage in a given phase of the electrical system is connected to the other input terminal of the comparator. The output of the comparator is thus a pulse width modulated signal, wherein the pulse width is proportional to the magnitude of the voltage in the electrical system. This signal is multiplied by a signal which is proportional to the amplitude of the current in the system. Thus, the output of the multiplier is proportional to the in-phase product of the current and voltage in the particular phase of the electrical system. This signal is summed with the product signals derived from other phases in the electrical system to derive a signal which is proportional to the total instantaneous power being imported or exported with respect to the system. This signal is integrated and converted to a pulse train wherein the frequency of the pulse train is proportional to the energy imported or exported with respect to the electrical system. The instantaneous power detected in each phase of the electrical system is also summed and averaged by means of an integrator, with the output of the integrator being detected by a zero crossover circuit to control the record and display unit to which the pulse train generated by the analog-to-pulse rate converter is coupled. Thus, if the polarity of the output of the averaging integrator is positive, for example, the output pulse train is coupled to the import record and display unit, whereas if the polarity of the output of the averaging integrator is negative, the pulse train will be connected to the export record and display unit. By this mechanism, depending upon the direction of current flow in the system, the energy being imported to or exported from the system is separately recorded and displayed in separate display units. Further, in order to provide for error correction, the output of the analog-to-pulse rate converter is coupled to a set of switches at the input of the comparators in each phase of the polyphase meter to thereby reverse the polarity of the output signals provided by the comparators. This in effect causes up/down integration which corrects for offset errors within the system.

BRIEF DESCRIPTION OF THE DRAWING

Other objects, features and advantages of the present invention will become more fully apparent from the following detailed disclosure of the preferred embodiment, the appended claims and the accompanying drawing in which there is illustrated a schematic block diagram of the preferred embodiment.

DETAILED DESCRIPTION OF THE PREFERRED EMBODIMENT

Refer now to FIG. 1 where there is a schematic block diagram of the one preferred embodiment of the present invention. The electrical system in which power and energy is being measured by the meter of the present invention may be of any type including, for example, a conventional 60 Hz power distribution system. Further, the electrical system may be importing, i.e., consuming, power or it may be exporting power to another system. Accordingly, it is an object of the present invention to detect the direction of power flow within the electrical system and to drive an appropriate output recording and display unit dependent upon whether energy is being imported or exported with respect to the system.

In the ensuing description of the invention, the operation of the meter for measuring instantaneous power in one phase of the polyphase system will be described in detail. It should be understood and appreciated that the measuring of instantaneous power in the other two phases will be the same as that for the phase described. The various components of the metering system for each phase will be identified by identical numerals and letters, except that the second and third phases will be distinguished by the use of primes. With respect to the first phase, the voltage $V_1$ is detected by means of a potential transformer 11. The current $i_1$ is measured by means of a current transformer 13. The potential transformer 11 has a first secondary winding 15 which is center-tapped to thereby derive two analog voltages $V_x$ and $-V_x$. Each of these voltages is proportional to the detected electrical voltage $V_1$ within the first phase of the system, and each is 180° out of phase with respect to one another. Thus, the signal on line 17 is in phase with the voltage across the primary of the transformer 11, while the voltage on line 19 is 180° out of phase with respect to the input voltage. The voltages $V_x$ and $-V_x$ are selectively coupled to one input of a comparator 21 which is of conventional design known in the art. These voltages are coupled to the comparator via up/down integration switch 23 and input resistor 25. The other input to the comparator 21 is derived from a triangular waveform generator generally identified by the numeral 31.

The triangular waveform generator 31 includes an integrator which comprises an amplifier 33 having the in-phase input thereto grounded via resistor 35, and having the inverted input connected to the output of a flipflop 37 via resistor 39. A feedback capacitor 41 is connected across the inverted input of the amplifier 33 and the output thereof to thereby provide a conventional integrator circuit. The output of the integrator is coupled to one input of the comparator 21 via resistor 43 and is also coupled to a pulse generating circuit 45 via resistor 47. The pulse generation circuit includes a first comparator 49 and a second comparator 51. The other input to the first comparator 49 is a fixed positive voltage $V_p$ and the other input to the comparator 51 is a constant negative voltage $V_n$. The outputs of the comparators 49 and 51 are connected to the set and reset inputs of flipflop 31, respectively. In operation, assume that the integrator is integrating upwardly in a positive direction, i.e., generating the positive-going portion of the triangular waveform. When the output voltage of the integrator reaches the voltage level $V_p$, comparator 49 generates an output pulse to set the flipflop 37. A pulse is thereby derived at the output of flipflop 37 which causes the integrator to start integrating downwardly. As the integrator integrates downwardly, i.e., generates an output voltage which goes in a negative direction, the negative-going portion of the triangular waveform is generated. When the integrator provides an output voltage which reaches the level $V_n$, comparator 51 generates an output signal for resetting the flipflop 37. When this occurs, the output of the flipflop 37 is switched to thereby cause the integrator to integrate upwardly again. This cycle repeats itself at a fairly rapid rate compared to the frequency of the line voltage in the electrical system. As an example, in the preferred embodiment the line voltage may be the conventional 60 cycle voltage provided in electrical distribution systems. In such a case, the triangular waveform generator 31 preferably generates a triangular waveform having a frequency of about 10 kHz.

Referring back to the comparator 21, the output of the comparator is a pulse train wherein each of the pulses has a time duration which is proportional to the instantaneous amplitude of the line voltage $V_1$ in the first phase of the electrical system. Thus, the output of the comparator 21 is a pulse width modulated signal having a duration which is proportional to the line voltage $V_1$. This signal is coupled to a switching circuit 53 which, as illustrated, is in mechanical form. However, it should be appreciated that the switch 53 can be an electronic switching circuit of a suitable type well known in the art.

The secondary 14 of the current transformer 13 has a center-tapped resistor 57 connected thereacross. The center tap of the resistor 57 is connected to ground, so that a first analog voltage $V_y$ is provided on line 59, and a second analog voltage $-V_y$ is provided on line 61. These voltages are proportional in magnitude to the current detected in the first phase of the system, but are 180° out of phase with respect to one another. It can be seen that the switch 53 serves to connect either the voltage $V_y$ or $-V_y$ to the input of integrator circuit 63 and sensing integrator circuit 65 depending upon the output of the comparator 21. As an example, when the output of the comparator 21 is high, the switch 53 couples the voltage $V_y$ to the integrator circuits 63 and 65, and when the output of the comparator 21 is low, the switch 53 couples the voltage $-V_y$ to each of these integrators.

The integrator 63 is of conventional design known in the art. The input to the integrator 63 is a chopped analog signal having an instantaneous amplitude which is proportional to the current measured in the first phase of the electrical system, with the duration of the chopped portion of the waveform being proportional to the magnitude of the voltage $V_1$. Thus, the partial input to the integrator 63 derived from switch 53 is proportional to the instantaneous partial power being imported or exported with respect to the first phase of the system. The partial power detected in the other phases of the system is also coupled to the integrator 63, as well as the sensing integrator 65, so that at the input of the integrator 63 is a signal which corresponds to the instantaneous total power being imported or exported with respect to the electrical system. The output of the integrator 63 is a signal which is proportional to the energy being consumed in the electrical system. This signal is converted to a pulse train by means of a pulse generating circuit 73. The pulse generating circuit 73 is somewhat similar to the pulse generator 45 in the triangular waveform generator 31. Thus, the pulse generating circuit includes comparators 75 and 77, and a flipflop circuit 79. The output of the integrator is coupled to each of the comparators 75 and 77 via resistor 81. A constant positive voltage $V_p$ is coupled to the other input of comparator 75 and a constant negative voltage $V_n$ is coupled to the other input of comparator 77. The output of comparator 75 is connected to the set input of the flipflop 79, and the output of comparator 77 is coupled to the reset input of comparator 79.

In operation, assume that the integrator 63 is integrating in a positive direction. When the voltage at the output of the integrator equals $V_p$, the comparator 75 provides an output signal for setting the flipflop 79. A pulse is thus generated which is coupled to either the import record and display unit 83, or to the export record and display unit 84. The import and export record and display units are of conventional design known in the art. The pulse train is selectively coupled to these display units via two-way switch 85. The pulse train output of the converter 73 is also coupled to a switch 87. The switch 87 connects the output of the circuit 73 to the up/down integration switches 23 of the meter. As will be seen hereinbelow, the phasing of the pulses generated by the pulse generating circuit 73 may be reversed, depending upon the direction of power flow with respect to the electrical system. The pulses coupled from switch 87 back to the up/down switches 23 causes the switch arms of the switches 23 to change the polarity of the voltage $V_x$ coupled to one input of the comparators 21. This has the effect of changing the polarity of the output of the multiplier switches 53 to thereby change the direction of integration in the integrator 63. Thus, the integrator 63 starts to integrate downwardly, and as the output of the integrator reaches the negative voltage level $V_n$, comparator 77 provides an output pulse for resetting the flip-flop 79. This results in an output which re-establishes the switch arms of switch 23 to couple the voltage $V_x$ to the comparators 21. The cycle then repeats itself. Thus, during the up and down integration process, the error signals due to offset voltages resulting from the integration process are averaged out. This has the effect of improving the dynamic range of the electronic kilowatt hour meter of the present invention.

In order to provide for two-way metering, i.e., separate recording and display of electrical energy imported and exported with respect to the system, the respective output signals from the switches 53, 53' and 53" are summed and coupled to the input of the sensing integrator 65. The sensing integrator 65 averages the summed outputs of the switches 53, 53' and 53" and provides at the output thereof a D.C. signal having a polarity which is dependent upon the position of the switches 23, 23' and 23" as well as the direction of power flow in the system. Assume, for example, that the output of the integrator 65 is positive, which corresponds to power being exported from the system to an external system. This positive signal is coupled via switch 89 to a pair of comparators 91 and 93. Comparators 91 and 93 detect the polarity of the output of the integrator 65 and control the position of the switch arms of switches 85 and 87. With the output of the integrator 65 being positive, the switch arms of switches 85 and 87 are in the position illustrated. Thus, the output pulse train from the pulse generating circuit 73 is coupled via switch 85 to the export record and display unit 84. At the same time, this pulse train is coupled via switch 87 to control the positions of the switch arms of switches 23, 23' and 23".

Assume now that power flow is reversed, and that the system becomes a net consumer of electrical energy. When this occurs, the current in the system is reversed, with the result that the integrator 65 will begin to integrate downwardly. Thus, the comparators 91 and 93 will provide an output signal when the integration goes negative to switch the switch arms of switches 85 and 87. Thus, switch 85 will couple the pulse train at the output of the converter 73 to the import record and display unit 83. At the same time, the switch arm of switch 87 will be closed on the output of inverter 95 so that the phase of the pulses coupled to the switches 23, 23' and 23" is shifted 180°. This has the effect of reversing the phasing of the voltage $V_x$ coupled to the inputs of the comparators 21 so that the error correction loop is in the proper phase relation.

Assume now that power is being exported from the electrical system, and that each of the switches 85, 87 and 89 are in the position illustrated. When an output pulse is generated by the pulse generating circuit 73, the status of switches 23, 23' and 23" are each changed to thereby cause the integrators 63 and 65 to change the direction of integration. At the same time, in order to provide for proper phasing, the output pulse of the converter 73 causes switch 89 to rotate into engagement with the output of inverter 99. Thus, with the integrator 65 integrating in the opposite direction, the polarity of the output of this integrator is reversed by inverter 99 so that the comparator circuit 91, 92 continues to compare the output of the integrator 65 as if there were no change in the direction of integration. This cycle repeats itself so that each time a pulse is generated by the pulse generating circuit 73, switch 89 is switched between the output of integrator 65 and the output of inverter 99 so that the switch arms of switches 85 and 87 remain in the same position when power is being continuously imported or exported. It is only when there is a changeover from exportation to importation of power or vice versa that the switch arms of switches 85 and 87 change positions.

It can be seen that the present invention provides an improved electronic kWh meter wherein error correction is provided, and wherein the importation and exportation of electrical energy is measured. It should be appreciated that there may be other alternate embodiments of the invention which fall within the spirit and scope thereof as defined by the appended claims.

What is claimed is:

1. A two-way electronic meter for measuring energy consumed in or exported from an electrical system comprising means for generating first and second analog signals, said signals being proportional to a current in said system, said first analog signal being 180° out of phase with respect to said second analog signal;

means for generating third and fourth analog signals, said signals being proportional to a voltage in said system, said third analog signal being 180° out of phase with respect to said fourth analog signal;

means for generating a relatively high frequency triangular waveform;

a comparator, said relatively high frequency triangular waveform being coupled to one input of said comparator;

switching means for selectively coupling said third or said fourth analog signal to the other input of said comparator, the output of said comparator being a pulse width modulated signal having a pulse width proportional to the amplitude of said voltage in said system;

means for multiplying said pulse width modulated output signal of said comparator with a signal proportional to said first and second current proportional analog signals, the output of said multiplier having an amplitude proportional to the electrical current in said system and having a pulse width proportional to the amplitude of the voltage in said system;

an integrator, said integrator being connected to the output of said multiplier, the output of said integrator being proportional to the energy consumed in said system;

a pulse generating circuit, the input of said circuit being connected to said integrator to thereby convert the output of said integrator to a pulse train having each pulse proportional to the energy consumed in said system;

first means for recording and displaying the energy consumed in said electrical system;

second means for recording and displaying the energy exported from said electrical system;

means for determining whether energy is being consumed by or exported from said electrical system; and switching means responsive to said determining means for coupling said pulse train to said means for displaying the energy consumed or exported from said electrical system.

2. The two-way electronic meter of claim 1 wherein said determining means comprises means for deriving the average instantaneous power in said system; and means for determining the polarity of said average instantaneous power, said switching means being responsive to said polarity determining means for selectively coupling said pulse train to said first or said second display means.

3. The two-way electronic meter of claim 2 further comprising error correction means responsive to the output pulses of said converter for operating said first switching means to alternately selectively couple said third or said fourth analog signals to said comparator to thereby correct offset integration errors in said meter.

4. The electronic meter of claim 3 further comprising means for inverting said pulse train and for coupling said inverted pulse train to said first switching means when the direction of power flow with respect to said electrical system changes.

5. The electronic meter of claim 4 wherein said analog-to-pulse rate converter comprises means for determining when the voltage level at the output of said integrator reaches a first predetermined positive level;

means for detecting when the output of said integrator reaches a second negative level; and means responsive to said detecting means for generating an output pulse when said predetermined positive and negative levels are reached.

6. The electronic meter of claim 5 wherein said multiplying means comprises a switch, said switch selectively connecting said first or said second analog signals to said integrator in accordance with the output of said comparator.

7. A two-way electronic meter for measuring energy consumed in or exported from a polyphase electrical system comprising a plurality of means for generating first and second analog signals, said signals being proportional to the current in each phase of said system wherein said first analog signal is 180° out of phase with respect to said second analog signal;

a plurality of means for generating third and fourth analog signals proportional to the voltage in each phase of said system;

means for generating a relatively high frequency triangular waveform signal;

a plurality of comparators, one for each phase of said polyphase system, said relatively high frequency triangular waveform signal being coupled to one input of each comparator;

a plurality of switching means for alternately selectively coupling said third or said fourth analog signals to the other input of said comparator, the output of said comparators being pulse width modulated signals wherein each signal has a pulse width proportional to the amplitude of the voltage in the corresponding phase of the polyphase electrical system;

a plurality of means for multiplying said pulse width modulated output signals of said comparators with the corresponding first and second current proportional analog signals for each phase, the output of said multipliers having an amplitude proportional to the amplitude of said electrical current in each phase of said system and having a pulse width proportional to the amplitude of the electrical voltage in each phase of said system;

means for summing said outputs of said multiplying means;

an integrator, said integrator being connected to the outputs of said summing means, the output of said integrator being proportional to the energy consumed in said system;

a pulse generating circuit, the input of said circuit being connected to said integrator to thereby convert the output of said integrator to a pulse train having each pulse proportional to energy consumed in said system;

a first means for recording and displaying the energy consumed in said electrical system;

a second means for recording and displaying the energy exported from said electrical system;

means for detecting whether power is being consumed by or exported from said electrical system; and switching means for selectively coupling said pulse train to said first or second display means dependent upon whether power is being consumed by or exported from said electrical system.

8. The two-way electronic meter of claim 7 wherein said detecting means comprises a signal averaging means connected to the outputs of each of said multipliers to derive a signal which is proportional to the average power consumed by or exported from said electrical system; and polarity detection means for determining the polarity of said average power signal, said polarity detection means controlling the position of said switching means for selectively coupling said pulse train to said first or said second display means.

9. The two-way electronic meter of claim 8 further comprising error correction means responsive to the output pulses of said converter for controlling said first switching means to alternately selectively couple said third or said fourth analog signals to said comparators, said error correcting means correcting the offset integration errors in said meter.

10. The two-way electronic meter of claim 9 wherein said multiplying means each comprises a switch, said switch selectively connecting said first or said second analog signals to said summing means in acordance with the output of said comparators.

11. The two-way electronic meter of claim 10 wherein said analog-to-pulse rate converter comprises means for determining when the voltage level at the output of said integrator reaches a first predetermined positive level;

means for detecting when the output of said integrator reaches a second negative level; and means responsive to said detecting means for generating an output pulse when said predetermined positive and negative levels are reached.

* * * * *